(12) United States Patent
Fischer et al.

(10) Patent No.: US 6,751,135 B2
(45) Date of Patent: Jun. 15, 2004

(54) METHOD FOR DRIVING MEMORY CELLS OF A DYNAMIC SEMICONDUCTOR MEMORY AND CIRCUIT CONFIGURATION

(75) Inventors: Helmut Fischer, Oberhaching (DE); Michael Sommer, Raubling (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/310,930

(22) Filed: Dec. 5, 2002

(65) Prior Publication Data

US 2003/0103376 A1 Jun. 5, 2003

(30) Foreign Application Priority Data

Dec. 5, 2001 (DE) ......................................... 101 59 798

(51) Int. Cl.[7] ................................................. G11C 8/00
(52) U.S. Cl. .................................. 365/194; 365/230.06
(58) Field of Search ........................... 365/194, 230.06, 365/236

(56) References Cited

U.S. PATENT DOCUMENTS

| 5,831,924 A | 11/1998 | Nitta et al. |
| 6,011,746 A | 1/2000 | Oh |
| 6,628,564 B1 * | 9/2003 | Takita et al. ............ 365/203.06 |

* cited by examiner

Primary Examiner—David Lam
(74) Attorney, Agent, or Firm—Laurence A. Greenberg; Werner H. Stemer; Ralph E. Locher

(57) ABSTRACT

A dynamic semiconductor memory has memory cells disposed in a cell field. The memory cells are connected to master word lines by way of a word line driver for driving the memory cells. As a rule, all the master word lines that are located in the segmented cell field are inactive, with at most one master word line being active. The master word lines are switched to an active low state, and a portion of the master word lines in a region of the cell field are inverted by a control device located at the beginning of the cell field. The deactivated master word lines in the cell field are at a ground potential, which, in view of the large number of existing master word lines, advantageously substantially reduces the leakage current that must be applied by the generators.

9 Claims, 1 Drawing Sheet

METHOD FOR DRIVING MEMORY CELLS OF A DYNAMIC SEMICONDUCTOR MEMORY AND CIRCUIT CONFIGURATION

BACKGROUND OF THE INVENTION

Field of the Invention

The invention relates to a method for driving memory cells of a dynamic semiconductor memory according to which the memory cells are configured in a cell field and are connected to an output of a word line driver by way of at least one segmented word line. The word line driver is controlled by a signal of a master word line. It is already known that, in memory modules such as dynamic random access memories (DRAMs) a plurality of word lines are spread over the entire surface in the cell field (array region) of the memory chip. The word lines are at a ground potential in a deactivated state. They can be driven by what are known as master word lines, which are usually at a high potential and are switched to ground potential, or 0 V, in an event of activation. Interposed between the master word line and the word line is a word line driver, which inverts the signal of the master word line, so that the corresponding word line switches to the high potential in the event of activation.

Given segmenting of a cell field, word line drivers are disposed in the word lines at regular intervals. The master word lines must then be extended to the individual word line drivers accordingly. The master word lines are usually led across the whole cell field in a separate metal level. For example, depending on the size of the semiconductor chip, 16,000 master word lines can be disposed across four quadrants. The master word lines must then run very close to one another owing to the tight space conditions. This creates the danger of unwanted shorts at adjacent lines because of particles.

Because all master word lines are at high potential in the deactivated state, a leakage current flows against ground, which can be large owing to the large number of master word lines, and which cannot be ignored.

Another disadvantage of this problem is that the leakage current has to be tapped from the operating voltage by the generators. In voltage boosting circuits such as pumps, the problem is amplified, because such circuits work at a very low level of efficiency for physical reasons, and therefore a still larger load current (for instance the input current of the pump is twice as high as the output current) must be supplied, which flows against ground as a wasted leakage current. This is unfavorable for capacitive, thermal, and economic reasons.

In the past, the above problems were avoided by not utilizing segmented word lines. But segmented word lines are becoming necessary with the progress of miniaturization of integrated circuits and with the increasing of their capacity, particularly in memory modules such as DRAMs.

SUMMARY OF THE INVENTION

It is accordingly an object of the invention to provide a method for driving memory cells of a dynamic semiconductor memory and a circuit configuration that overcomes the above-mentioned disadvantages of the prior art methods and devices of this general type, which reduces a load on a supply network that is caused by unwanted leakage currents in a dynamic semiconductor memory.

With the foregoing and other objects in view there is provided, in accordance with the invention, in a dynamic semiconductor memory having memory cells configured in a cell field, a circuit configuration for driving the memory cells. The circuit configuration contains a master word line having a first part, a second part, and a third part, at least one segmented word line connected to the memory cells, and a word line driver having an output connected to the segmented word line and through the segmented word line to the memory cells. The word line driver is connected to and driven exclusively by the master word line. The word line driver is disposed in the cell field. A first control device is connected to the first part of the master word line and disposed outside of the cell field. The first control device has an output connected to the second part of the master word line. A second control device is connected to the second part of the master word line. The second control device is disposed in a region of the word line driver and connected to the word line driver through the third part of the master word line. The segmented word line, through the word line driver, is connectible to a supply voltage or a ground potential in dependence on a signal on the master word line. The master word line is switchable to a high logic state for activating the word line driver.

The relative advantage of the inventive method for driving the memory cells of the dynamic semiconductor memory is that the portions of the master word lines (inverted master word lines) which run in the cell field are at ground potential in the deactivated state. Only if one of the master word lines outside the cell field is switched to low does the relevant (selected) inverted master word line in the cell field get switched to high. Because this can only be a master word line and is only temporary, the emerging leakage current is extremely small, because the several remaining master word lines are still at ground potential, and therefore no leakage current can develop in those lines. Shorts to other metallization levels such as ground or Vbleq do not cause any long-term loading of the supply generators (Vpp generators) either. In addition, the useful current that must be applied by the generators (Vpp pumps) is substantially smaller and thus the input current of the pump can be reduced substantially, particularly given its poor performance. It is particularly advantageous that this circuit behavior can be achieved with a simple control circuit which is disposed at the beginning of the cell field and which inverts the signal of the master word line.

It is particularly advantageous that the control circuit is constructed as an inverter, with the signal at its input being tapped at the output of the inverter as an inverted signal.

In order to achieve these advantages, the word line drivers for each segmented word line must be moved into the cell field; preferably an additional control device is disposed in the immediate vicinity of the word line driver. That way, practically the entire plane of the master word lines is at ground potential in the deactivated state, and therefore the leakage current is minimal.

It is also advantageous that the additional control device re-inverts the inverted signal of the master word lines. In that way, the original control signal of the master word line is obtained for driving the word line driver, and the wiring of the remaining control logic, including the controlling of the selection transistors and memory cells, does not have to be changed.

With this configuration, the inverted signals are switched to low (ground) by deactivated master word lines and to high (Vpp potential) by an activated master word line in the cell field.

The two control devices are simply realized as gate circuits. These contain simple logical switching transistors such as FETs and are easy to integrate in the silicon chip.

An advantageous alternative solution is to effectuate the inverting of the signals by a one-bit counter. The advantage of the one-bit counter is that it is driven only with a short impulse, being edge-triggered, whereupon it flips into its output state and holds that until the next impulse. This is particularly advantageous for the additional control circuit with respect to minimizing leakage currents. The reason is that a possible leakage current to a neighboring master word line or ground can flow only as long as the drive pulse lasts.

It is also a particularly advantageous solution for the word line driver control to take into account the delays that occur based on the signal transit times through the gate circuits of the two control devices. Taking these delay times into account makes it possible to advantageously achieve an optimal synchronization of the control times for the word line drivers.

Other features which are considered as characteristic for the invention are set forth in the appended claims.

Although the invention is illustrated and described herein as embodied in a method for driving memory cells of a dynamic semiconductor memory and a circuit configuration, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
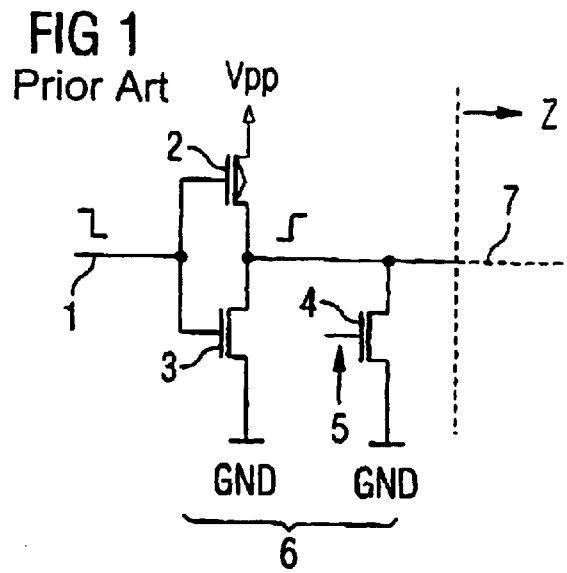
FIG. 1 is a circuit diagram of a circuit configuration having a master word line and according to the prior art.

Referring now to the figures of the drawing in detail and first, particularly, to FIG. 1 thereof, there is shown a circuit configuration that is already known from the prior art but will be described first for the sake of a better understanding the invention, which will be described later in connection with FIGS. 2 and 3. The circuit configuration represented in FIG. 1 has been simplified and schematically rendered for viewing purposes, given the extraordinarily complex construction of the overall memory circuit, with the wiring of the individual elements on the semiconductor chip being led across several stacked levels (isolated layers).

For instance, in a memory module (e.g. DRAM) there are 16,000 memory cells (not illustrated in FIG. 1) disposed in 4 quadrants in a cell field Z, which can be driven by word lines 7 and by selection transistors. The word lines 7 are driven by master word lines 1 in turn. The master word lines 1 have the functionality of drive signal lines. FIG. 1 shows the master word line 1 connected to an input of a word line driver 6. The word line driver 6 contains two switching transistors 2 and 3, which are realized as field effect transistors (PFET, NFET). The first switching transistor 2 switches the output-side word line 7 to a Vpp (high) potential, while the second switching transistor 3 can switch the word line 7 to a ground potential. Normally, the master word lines 1 operate according to active-low logic; for example, they are at a high potential (Vpp) in the deactivated state and are switched to low (ground) in the active state. The word line 7 reacts with an inverted signal, as the symbols in FIG. 1 indicate. The Vpp potential is an elevated voltage and is generated from a low supply source by a Vpp pump. This representation also is a schematic sequence, because in practice there are usually four lines at terminal Vpp, which are provided with decoder signals with which one of four word lines 7 can be selected. Thus, four different word lines 7 can be selected with a master word line 1.

FIG. 1 also reveals that a third switching transistor 4 is provided, which can connect the word line to ground GND via a control input 5 (precharge). During precharge, all the word lines 7 are connected to ground. The selection transistors on a load side are then blocked. The signals are inverted in the event of driving.

The vertical dotted line and an arrow Z indicate the beginning of the cell field Z (array area).

In contrast, and according to the subject matter of the invention, this configuration is changed. FIG. 2 represents a first exemplifying embodiment of the invention, wherein the word line driver 6 has been moved to the right of the vertical dotted line and into the cell field Z. As described above, the word line driver 6 drives the word line 7 that is connected on the output side. In this case, the word line 7 is segmented. The word line 7 is subdivided into several portions, each portion (segment) being driven by a respective word line driver 6. The word line driver 6 thus drives only a certain segment length of the word line 7. The word line 7 can be divided into 16 or 32 segments, for instance. On the other hand, the master word lines in the cell field Z traverse the whole cell field Z and form the metal level 1 in our example.

Figure 2:
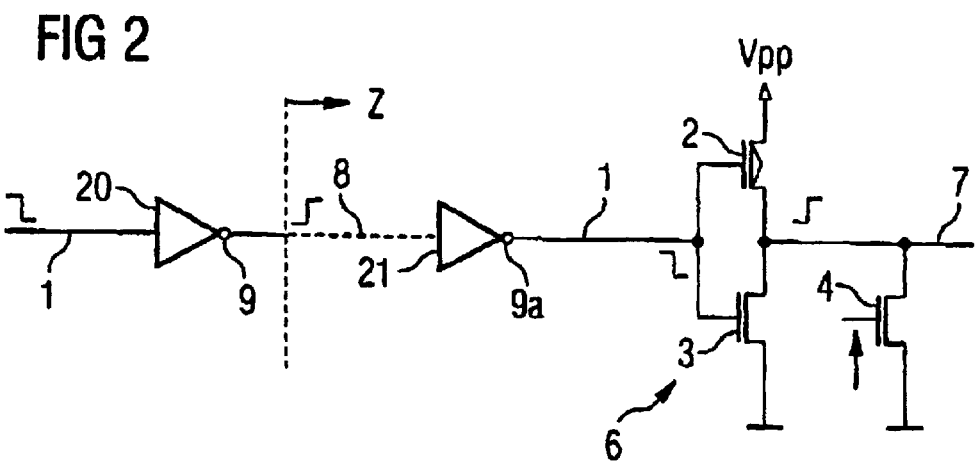
FIG. 2 is a circuit diagram of a first exemplifying embodiment of a circuit configuration according to the invention.

According to FIG. 2, a control device 20 has been interposed at the beginning of the cell field Z, which is driven by the master word line 1. The control device 20 is constructed as a gate circuit, preferably an inverter, and inverts the incoming signal of the master word line 1. The inverted signal 8 then stands pending at its output 9, which signal is then conducted through the cell field. The inverted signal 8 of the master word line 1 is transmitted on a line that represents a portion of the master word line 1. In order to enable the word line driver 6 to be driven with the original logic signal, the inverted signal 8 is re-inverted by an additional control device 21, whereupon the original signal corresponding to the master word line 1 stands pending at its output 9a. In this exemplifying embodiment, the additional control device 21 is likewise constructed as an inverter and preferably disposed in the immediate vicinity of the word line driver 6.

The idea of the invention is to switch all lines in the cell field Z—which are advantageously disposed in a common plane, for instance the metal level 1—to low when they are deactivated. In that way, no leakage currents can flow to ground, and the Vpp generator is relieved of load. In order to achieve this, the master word line 1 operates according to active-low logic. Therefore, the master word lines 1 are at a logical high (Vpp potential) in the deactivated state. The inverted signals 8 in the cell field Z are then naturally at a low, and therefore no leakage current can flow to ground, as described above.

On the other hand, when one of the available master word lines 1 is activated, it switches to low (ground potential), in which case the selected master word line in the cell field Z switches to high. Only this one selected master word line in the cell field loads the power network with a leakage current during the activation period. However, the current load is tolerable in view of the many thousands of deactivated master word lines that do not generate a leakage current. Shorts to ground or to Vbleq (voltage of an equalizer), which are present in other metal levels (metal level 2 or 0), do not produce long-term loading of the Vpp generators, either, and therefore substantial improvements can also be achieved in case of such errors.

For physical reasons, interposing the two control devices 20, 21 creates time delays in the passage of the signals through the gate. A particularly advantageous solution is to take the gate transit times into account in controlling the word line driver 6. Taking the delay times into account makes it possible to achieve an optimal synchronization of the control times for the word line drivers.

Figure 3:
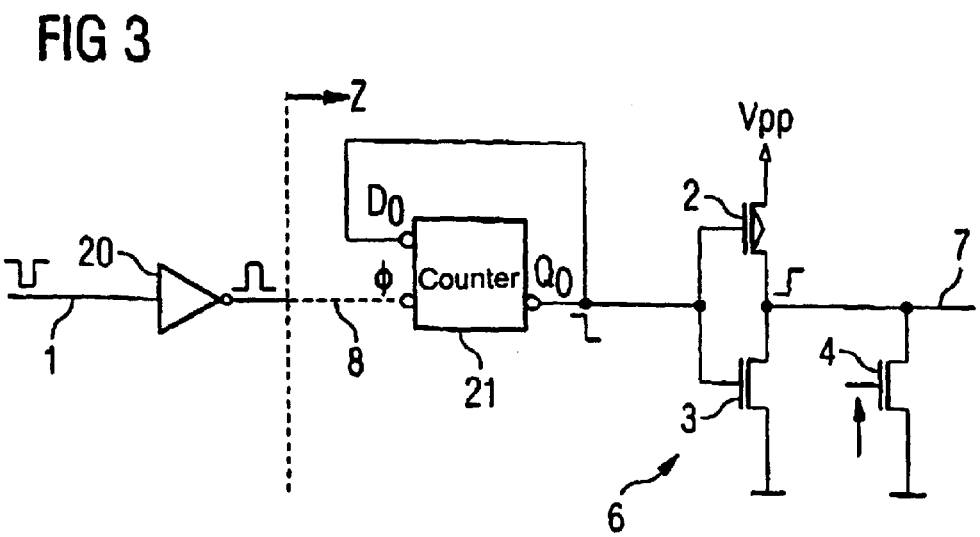
FIG. 3 is a circuit diagram of a second exemplifying embodiment of the circuit configuration according to the invention.

A second exemplifying embodiment of the invention is represented in FIG. 3. In this case, the second control device 21 has been realized as a one-bit counter. The inverted signal 8 is conducted to an input $\phi$ and is then available at an output $Q_0$ as a re-inverted signal. In this example, an additional input $D_0$ of the counter 21 is likewise connected with the output $Q_0$. The counter 21 is thus connected as a ring counter that switches its output to high or low in alternation with each input pulse. The advantage of this circuit configuration is that a short drive impulse on the master word line 1 is sufficient to drive the word line driver 6 accordingly.

For example, in active-low logic, when the master word line 1 is temporarily switched to low, the word line driver 6 receives a high or low signal, depending on the status of the one-bit counter 21. The switch status is maintained until the next impulse re-inverts the level. The signal of the word line driver 6 can thus be switched in easily. Furthermore, a GC word line can be disconnected.

The GC word lines represent a separate metal level. The GC level corresponds to the gate lines of the switching transistors. Because the switching transistors are configured very close to one another, their gate is drawn along the cell field Z as a plane. It is thus possible to drive the GC word lines easily with the aid of a simple switch impulse.

Another advantage of the configuration is that, owing to the short impulse, no notable leakage currents can flow to a neighboring line that is switched to low. A leakage current can only flow when the master word line is at high potential.

We claim:

1. In a dynamic semiconductor memory having memory cells configured in a cell field, a circuit configuration for driving the memory cells, the circuit configuration comprising:

a master word line having a first part, a second part, and a third part;

at least one segmented word line connected to the memory cells;

a word line driver having an output connected to said segmented word line and through said segmented word line to the memory cells, said word line driver connected to and driven exclusively by said master word line, said word line driver disposed in the cell field;

a first control device connected to said first part of said master word line and disposed outside of the cell field, said first control device having an output connected to said second part of said master word line; and a second control device connected to said second part of said master word line, said second control device disposed in a region of said word line driver and connected to said word line driver through said third part of said master word line, said segmented word line through said word line driver being connectible to one of a supply voltage and a ground potential in dependence on a signal on said master word line, said master word line being switchable to a high logic state for activating said word line driver.

2. The circuit configuration according to claim 1, wherein said first control device and said second control device are inverter circuits.

3. The circuit configuration according to claim 2, wherein said second control device is an inverter circuit in a form of a one-bit counter.

4. The circuit configuration according to claim 1, wherein:

said word line driver is one of a plurality of word line drivers; and said segment word line is one of a plurality of segmented word lines and each of said segmented word lines is connected to a respective one of said word line drivers disposed in the cell field.

5. The circuit configuration according to claim 1, wherein said first control device and said second control device are gate circuits.

6. The circuit configuration according to claim 5, wherein said gate circuits are inverter circuits.

7. A method for driving memory cells of a dynamic semiconductor memory, the memory cells forming a cell field, the memory cells connected to an output of a word line driver by way of at least one segmented word line, and the word line driver disposed in the cell field, which comprises the steps of:

driving the word line driver exclusively by a signal on a master word line, a first part of the master word line being connected to a first control device disposed outside the cell field and an output of the first control device connected to a second part of the master word line, the second part of the master word line connected to a second control device;

connecting the segmented word line to one of a supply voltage and a ground potential through the word line driver in dependence on the signal on the master word line; and switching the master word line to a high state for activating the word line driver.

8. The method according to claim 7, which further comprises inverting signals at a first end and at a second end of the master word line.

9. The method according to claim 8, wherein the inverting step comprises using a one-bit counter for inverting the signal at the second end of the master word line.

* * * * *